United States Patent [19]

Snow

[11] Patent Number: 5,510,627
[45] Date of Patent: Apr. 23, 1996

[54] INFRARED-TO-VISIBLE CONVERTER

[75] Inventor: Eric S. Snow, Springfield, Va.

[73] Assignee: The United States of America as represented by the Secretary of the Navy, Washington, D.C.

[21] Appl. No.: 267,697

[22] Filed: Jun. 29, 1994

[51] Int. Cl.$^6$ .................... H01L 27/142; H01L 29/201; H01L 31/101
[52] U.S. Cl. ................... 257/21; 257/85; 257/189
[58] Field of Search .................. 257/21, 189, 85

[56] References Cited

U.S. PATENT DOCUMENTS

| | | |
|---|---|---|
| 4,620,214 | 10/1986 | Margalit et al. . |
| 4,679,068 | 7/1987 | Lillquist et al. . |
| 4,807,006 | 2/1989 | Rogers et al. . |
| 4,822,992 | 4/1989 | Bar-Joseph et al. . |
| 4,828,368 | 5/1989 | Efron et al. . |
| 4,860,068 | 8/1989 | Gossard et al. . |
| 4,873,555 | 10/1989 | Coon et al. . |
| 4,914,296 | 4/1990 | Reinhold et al. . |
| 5,036,371 | 7/1991 | Schwartz . |
| 5,077,593 | 12/1991 | Sato et al. . |
| 5,160,991 | 11/1992 | Delacourt et al. . |
| 5,160,992 | 11/1992 | Gerard et al. . |
| 5,198,682 | 3/1993 | Wu et al. . |
| 5,238,868 | 8/1993 | Elman et al. . |
| 5,239,186 | 8/1993 | McIver et al. . |
| 5,296,720 | 3/1994 | Wen et al. .................. 257/21 |

OTHER PUBLICATIONS

Levine et al., "*Broadband 8–12 μm High-Sensitivity GaAs Quantum Well Infrared Photodetector*", Appl. Phys. Lett. 54 (26), 26 Jun. 1989, pp. 2704–2706.

Levine et al., "*Bound–To–Extended State Absorption GaAs Superlattice Transport Infrared Detectors,*", J. Appl. Phys. 64 (3), 1 Aug. 1988, pp. 1591–1593.

Levine et al., "*High–Detectivity $D^*=1.0\times 10^{10}$ cm$\sqrt{\text{Hz}}$/W GaAs/AlGaAs Multiquantum Well $\lambda=8$, 3 μm Infrared Detector*", Appl. Phys. Lett. 53 (4), 25 Jul. 1988, pp. 296–298.

Levine et al., "*High Sensitivity Low Dark Current 10 μm GaAs Quantum Well Infrared Photodetectors*", Appl. Phys. Lett., vol. 56, No. 9, 26 Feb. 1990, pp. 851–853.

Capasso et al., "*New Quantum Photoconductivity And Large Photo–Current Gain By Effective–Mass filtering In A Forward–Biased Superlattice p–n Junction*", Physical Review Letters, vol. 55, No. 10, 2 Sep. 1985, pp. 1152–1155.

*Primary Examiner*—Jerome Jackson, Jr.
*Attorney, Agent, or Firm*—Thomas E. McDonnell; Daniel Kalish; Charles J. Stockstill

[57] ABSTRACT

A quantum well infrared photodetector comprises multiple quantum well detectors formed within a single P-N structure forward-biased by an external voltage source, for directly converting infrared radiation having a wavelength in the range of approximately 4–15 μm into visible radiation or near infrared radiation. Multiple quantum well detectors disposed between the P-N contact layers are comprised of alternating gallium arsenide (GaAs) quantum well layers, aluminum gallium arsenide (AlGaAs) barrier layers and alternatively, a blocking layer of aluminum arsenide (AlAs) positioned between a last aluminum gallium arsenide (AlGaAs) barrier layer and the N contact layer; and are forward-biased by the external voltage source in order to produce band-gap luminescence by radiative recombination of excess carriers representative of electrons and holes in the N contact layer when the P contact layer is illuminated with optical energy of incident infrared radiation.

14 Claims, 7 Drawing Sheets

INFRARED-TO-VISIBLE CONVERTER

BACKGROUND OF THE INVENTION

The present invention relates to a device for converting infrared radiation into near infrared radiation or visible radiation, and more particularly, to a semiconductor device comprising multiple quantum wells in a forward-biased P-N structure, for directly converting incident infrared radiation in the range of approximately 4–15 µm into near infrared radiation or visible radiation.

Infrared imaging is a topic of current interest due to potential military and commercial applications. Current infrared imaging technology consists of designing infrared photo-detector elements which are then set in an array to detect two dimensional images of infrared light. Electrical signals from each element of the array must be detected and processed before application to a separate display terminal where a visible representation of the infrared image is produced.

A typical infrared imaging converter is described by way of example, in U.S. Pat. No. 4,914,296 for "Infrared Converter" issued to Reinhold et al. as shown in FIG. 1, where infrared radiation IR emanating from a scene is converted by an infrared detector array 1 comprising a three-by-three array of sensitive elements into a beam of electrons, designated as "e", to be multiplied by an electron multiplier 3 via a first vacuum 2 and converted into visible radiation by a plurality of light-emitting-diodes LEDs 5 via a second vacuum 4. The process of electrically sampling each image element in a large array as disclosed by Reinhold et al. '296 is however, technically difficult and expensive.

Conventional infrared detectors such as Reinhold et al. '296 rely upon mercury cadmium telluride (HgCdTe) detectors and silicon semiconductor detectors for the detection of infrared radiation. A HgCdTe infrared detector is based on a P-I-N semiconductor and operates on the principle of detecting infrared photons by measuring electrons that are released from the valence band to the conduction band in the intrinsic layer from the absorption of the infrared photon energy.

Similarly, a silicon semiconductor detector also detects infrared radiation by the absorption of infrared photons that release the electrons into the conduction band to enable an electric field to direct the released electrons to specific terminal contacts where the released electrons can be measured. Both of these types of infrared detectors suffer from a number of drawbacks including the difficulties associated with current fabrication techniques, such as molecular beam epitaxy (MBE) and metal organochemical vapor deposition (MOCVD), and integration with other circuitry, such as read-out circuits in order to enable the detected photons to be imaged.

Current developments in the art of infrared detection utilize contemporary fabrication techniques such as MBE and MOCVD, and endeavor to provide devices such as quantum well infrared photodetectors (QWIP) that are adaptable to read-out circuitry for enabling an infrared image to be seen as a visible image.

A quantum well infrared photodetector is typically a device as shown in FIG. 2A that incorporates an array of aluminum gallium arsenide (AlGaAs) barrier layers 22 and appropriately doped gallium arsenide (GaAs) well layers 23, in an alternating pattern forming a multiple quantum well heterostructure between adjacent ohmic contact layers 21 and 25. Both the ohmic contact layers 21 and 25 as well as the alternating AlGaAs barrier layers 22 and GaAs well layers 23 are doped with n-type impurities. Blocking layer 24 may also be doped at an edge proximate to contact layer 25 in order to maximize the ohmic contact between contact layer 25 and the alternating AlGaAs barrier layers 22 and GaAs well layers 23. An energy diagram of a typical QWIP detector is illustrated in FIG. 2B, where dopant electrons "e" bound in the well structure formed by the conduction band CB of the GaAs well layers 23 acquire enough optical energy from absorbed incident infrared radiation to reach the conduction band CB of the AlGaAs barrier layers 22 in order to be free carriers measurable as induced photocurrent by infrared radiation. Dopant electrons can also be excited to give rise to free carriers by thermal energy with thermal activation energy which is approximately equal to the AlGaAs/GaAs conduction band offset.

In such QWIP detectors, dopant electrons "e-" are confined in the GaAs well layers 23 of a heterostructure quantum well between the two ohmic contact layers 21 and 25. Bias across the ohmic contacts 21 and 25 provides an electric field which, when the electrons "e-" are excited above the tops of the AlGaAs barriers 22, pushes the electrons toward the anode, giving rise to a photocurrent that is measured as an indication of the magnitude of the incident infrared radiation.

An example of a QWIP detector is U.S. Pat. No. 4,620,214 for "Multiple Quantum-Well Infrared Detector" issued to Margalit et al. which provides the multiple quantum-well structure with upper and lower ohmic contacts to bias the individual quantum-well layers in order to achieve photocurrent. Generally, the thickness of each quantum well layer of GaAs is usually small, generally about 20–60 Angstroms and most preferably about 40 Angstroms. The thickness of each barrier layer of AlGaAs is generally in the range of about 80–300 Angstroms. It is also preferred that each quantum well layer be heavily doped n-type with a donor impurities such as Ge, S, Si, Sn, Te or Se. Lattice match and thermal coefficient considerations, impurity concentrations and fabrication techniques for these QWIP detectors are well known in the art. The sensitivity of the QWIP detectors has also been improved by increasing the barrier layer of AlGaAs from about 300 Angstroms to about 500 Angstroms, while maintaining the thickness of the quantum well layer of GaAs of approximately 40 Angstroms as reported in Levine et al., "High Sensitivity Low Dark Current 10 µm GaAs Quantum Well Infrared Photodetectors," Applied Physics Letters, Vol 56, No. 9, 26 Feb. 1990, pages 851–853. Such an increase in the barrier layer width of AlGaAs would reduce the tunneling dark current, which consists primarily of electrons tunneling through the barrier layer of AlGaAs between the ground states of adjacent quantum well layers of GaAs, thereby significantly increasing the level of sensitivity and quantum efficiency of the QWIP detectors.

Other techniques to improve the sensitivity of the QWIP detectors are disclosed, for example, in U.S. Pat. No. 5,077,593 for "Dark Current-Free Multiquantum Well Superlattice Infrared Detector," where Sato et al endeavors to keep the barrier layer of AlGaAs thin, but a thicker tunneling current blocking layer 24 at the end of the super-lattice in the path of the tunneling electrons as shown in FIG. 2A, in the range of approximately 800–3000 Angstroms in order to enhance the detector's quantum efficiency.

In typical QWIP detectors, the detection range of infrared radiation is usually in the range of between 4 to 15 µm of wavelength, depending upon how the quantum well width and the barrier height of the QWIP detectors are constructed. One example of such construction is disclosed by U.S. Pat. No. 5,238,868 for "Bandgap Tuning Of Semiconductor Quantum Well Structures" issued to Elman et al. which contemplates an ion implantation technique for selectively tuning the bandgap of the quantum well layers to permit an accurate and precise modification of the geometrical shapes, width, barrier heights and composition of the quantum well in a spatially selective manner.

For the detection of long wavelength infrared radiation, designs such as those disclosed by Levine et al., "Bound-to-Extended State Absorption GaAs Superlattice Transport Infrared Detectors," J Applied Physics Letters, Vol 64, No. 3, 1 Aug. 1988, pages 1591–1593; "Broadband 8–12 μm High-Sensitivity GaAs Quantum Well Infrared Photodetector," Applied Physics Letters, Vol. 54, No. 26, 26 Jun. 1989, pages 2704–2706; and "High-Detectivity $D^*=1.0\times10^{10}$cm/Hz/W GaAs/AlGaAs Multiquantum Well $\lambda=8.3$ μm Infrared Detector," Applied Physics Letters, Vol. 53, No. 4, 25 Jul. 1988, pages 296–298, can be employed.

For the detection of medium wavelength infrared radiation, U.S. Pat. No. 5,160,991 for "Electromagnetic Wave Detector And Image Analyzer Comprising A Detector Of This Type" issued to Delacourt et al. may be noted. Variations on the theme are disclosed by U.S Pat. No. 5,239,186 for "Composite Quantum Well Infrared Detector" issued to McIver et al. which envisions a multiple quantum well infrared detector having a wider infrared radiation bandwidth; and U.S. Pat. No. 5,036,371 for "Multiple Quantum Well Device" issued to Schwartz which contemplates one wide well of GaAs and a plurality of narrower wells spaced from each other and sandwiched between a plurality of barriers of AlGaAs in order to detect a desired spectral range.

Other improvements are disclosed, for example, in U.S. Pat. No. 5,198,682 for "Multiple Quantum Well Superlattice Infrared Detector With Graded Conductive Band" issued to Wu et al. which sought to establish the barrier energy level gradients of the quantum well barrier layers to produce an internal electric field within the AlAs/AlGaAs superlattice that facilitates the movement of photoexcited charge carriers through the superlattice, even in the absence of an external bias voltage from the upper and lower ohmic contacts.

In these structures, the infrared radiation absorption leads directly to a measured photocurrent; however none of the foregoing structures provides means for directly converting infrared radiation into visible radiation. U.S. Pat. No. 5,160,992 for "Device For The Conversion Of An Infrared Radiation Into Another Radiation Of Energy Greater Than That Of This Infrared Radiation" issued to Gerard et al. however, provides a heterostructure with a double quantum well employed as a P-N junction in order to absorb infrared radiation to emit visible radiation as a result of the recombination of excess electrons and holes created in the quantum well while the P-N junction is flat banded by an external optical source. A specific double quantum well structure is shown in FIG. 3A where two wells 32 and 34 of the same width and same depth are doped with impurity elements of N-type "donor" and P-type "acceptor," respectively, in order to create excess electrons and excess holes for the subsequent recombination process. Barrier layers of AlGaAs 31 and 35 are undoped and identical in character with each forming a potential barrier for the electrons and holes. Central AlGaAs barrier layer 33 is also undoped and forms an intermediate potential barrier of greater band-gap for containing the electrons and holes within the two GaAs wells 32 and 34 in a delocalized electronic state. FIG. 3B illustrates an energy diagram of the double quantum well structure as shown in FIG. 3A, where dopant electrons "e", as ionized donors, bound in the quantum well 32 are optically excited by the infrared radiation across the bandgap, from a state of the miniband $e_1$, which state is principally localized within the quantum well 32, into a delocalized state of the miniband $e_3$. These dopant electrons are then recombined with holes, or ionized acceptors (not shown), which are already present within the quantum well 34 to thereby generate visible radiation.

The efficiency of the absorption of the infrared radiation disclosed by Gerard et al. '992 is, however, inadequate. Although the absorption efficiency may be increased by increasing the number of pairs of quantum wells and forming a series of P-N structures in the same arrangement as was shown in FIG. 3A, the construction of such P-N structures comprised of multiple quantum wells is not easily realizable. Moreover, the Gerard device only operates in a nonequilibrium state established by an optical regeneration source. In other words, the Gerard device must be prompted with pulse light to bring it out of equilibrium and into an unstable state in order to detect infrared light. The sensitivity of the Gerard device depends on the number of optically generated carriers which would decay back to equilibrium via the tunneling dark current or photocurrent induced by the infrared radiation. Thus, the sensitivity of Gerard device suffers as a function of time (i.e., time integrated dark current) and the history of the infrared radiation exposure. In addition, the regeneration requirement of the recombination mechanism of Gerard et al. '992 unduly slows down the response time for emitting visible radiation, thereby decreasing the level of sensitivity of the device.

SUMMARY OF THE INVENTION

Accordingly, it is a principal object of the present invention to provide an improved and sensitivity-stable quantum well infrared photodetector for directly converting infrared radiation into visible radiation and near infrared radiation without using a large array of individual detectors and without being dependent upon the "tunneling dark current" and the history of infrared radiation exposure.

It is one object of the present invention to provide an infrared-to-visible converter having a simplified semiconductor structure comprised of multiple quantum well detectors with alternating gallium arsenide quantum well layers and aluminum gallium arsenide barrier layers and a blocking aluminum arsenide layer, formed within a single forward-biased P-N structure for directly converting infrared radiation having a wavelength in the range of approximately 4–15 μm into visible radiation.

It is another object of the present invention to provide an infrared-to-near-infrared converter comprised of multiple quantum well detectors with alternating gallium arsenide quantum well layers and aluminum gallium arsenide barrier layers, formed within a single P-N junction, for directly converting infrared radiation having a wavelength in the range of approximately 4–15 μm into near infrared radiation while in a forward-bias state controlled by an external voltage source.

In order to achieve these and other objects, the present invention endeavors to place a high resistance multiple quantum well infrared detector in a forward biased P-N junction in order to subsequently produce band-gap luminescence in response to optical energy of incident infrared radiation. In one embodiment of the present invention, an infrared-to-visible converter is constructed with a substrate; a first contact region doped with N-type impurities and disposed on the substrate; a second contact region doped with P-type impurities and disposed on the first contact region, the first contact region and the second contact region forming a P-N junction; a multiple quantum well structure comprising a plurality of alternating gallium arsenide (GaAs) quantum well layers and aluminum gallium arsenide (AlGaAs) barrier layers formed between the first contact region and the second contact region within the P-N junction, both the gallium arsenide quantum well layers and the aluminum gallium arsenide barrier layers being heavily doped with N-type impurities and forming a double heterojunction structure; an aluminum arsenide (AlAs) blocking layer positioned between a last aluminum gallium arsenide (AlGaAs) barrier layer and the second contact region; and a device for forward biasing the P-N junction to enable the infrared-to-visible converter to emit the visible radiation by radiative recombination of excess carriers representative of electrons and holes in the second contact region, when the first contact region is illuminated with incident infrared radiation.

In a second embodiment of the present invention, an infrared-to-near-infrared converter is constructed with a substrate; a N-type contact region disposed on the substrate; a multiple quantum well structures doped with N-type impurities and formed by a plurality of alternating gallium arsenide quantum well layers and aluminum gallium arsenide barrier layers disposed on the N-type contact region, for responding to infrared radiation of a first wavelength; a P-type contact region disposed adjacent to the multiple quantum well structures to form a P-N junction with the N-type contact region; and a device for forward biasing the P-N junction to enable the infrared-to-near-infrared converter to emit near infrared radiation of a second wavelength shorter than said first wavelength of the infrared radiation by radiative recombination of excess carriers representative of electrons and holes in the second contact region, when the N-type contact region is illuminated with incident infrared radiation. The emitted near infrared radiation can then be easily observed and readily converted into visible radiation by currently available off-the-shelf converter devices.

The present invention is more specifically described in the following paragraphs by reference to the drawings attached only by way of example.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENTS

The following description of the preferred embodiments is merely exemplary in nature and is in no way intended to limit the invention or its application or uses.

Figure 1:
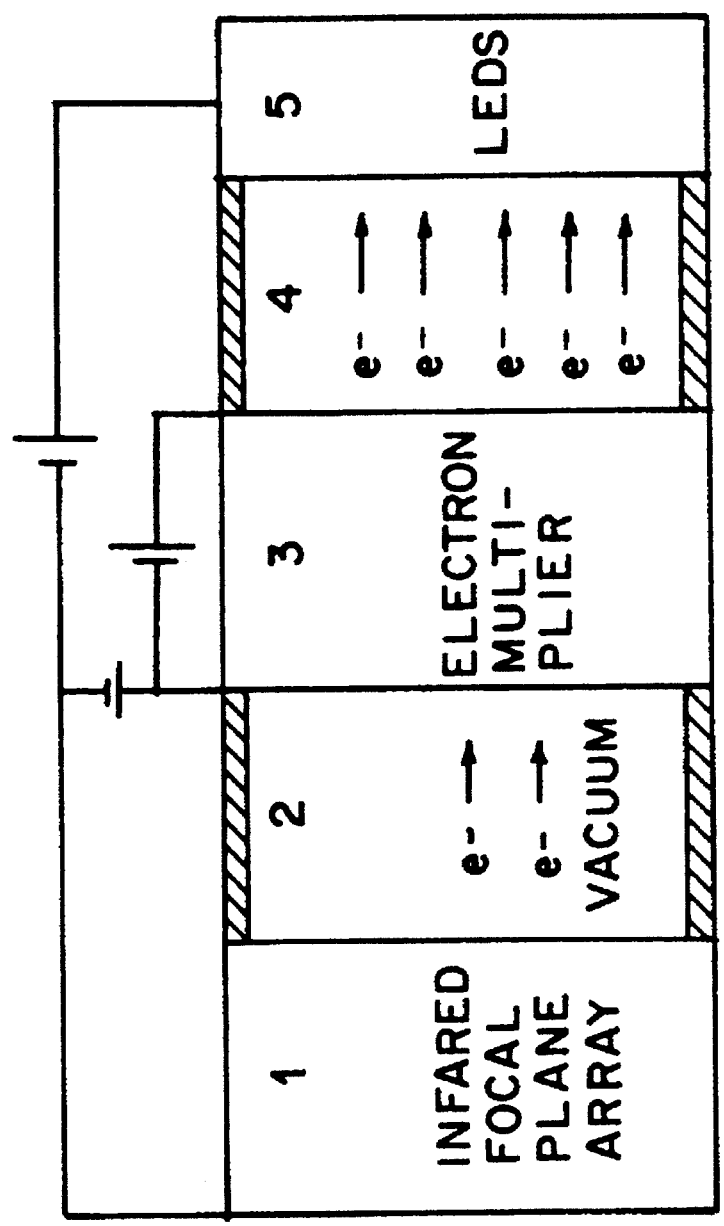
FIG. 1 illustrates a conventional infrared imaging converter utilizing an infrared detector array.
Figure 2A:
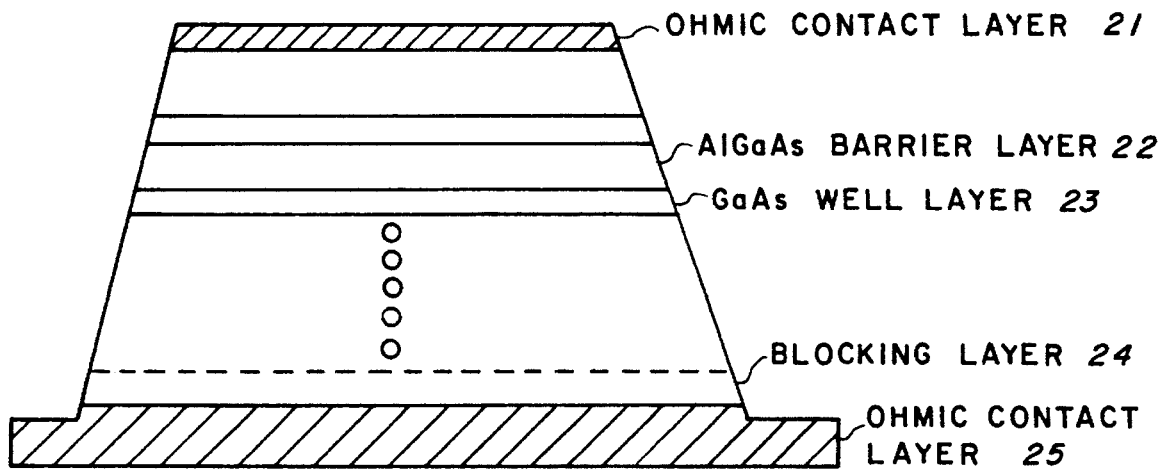
FIG. 2A illustrates a conventional quantum well infrared photodetector for converting infrared radiation into photocurrent.
Figure 2B:
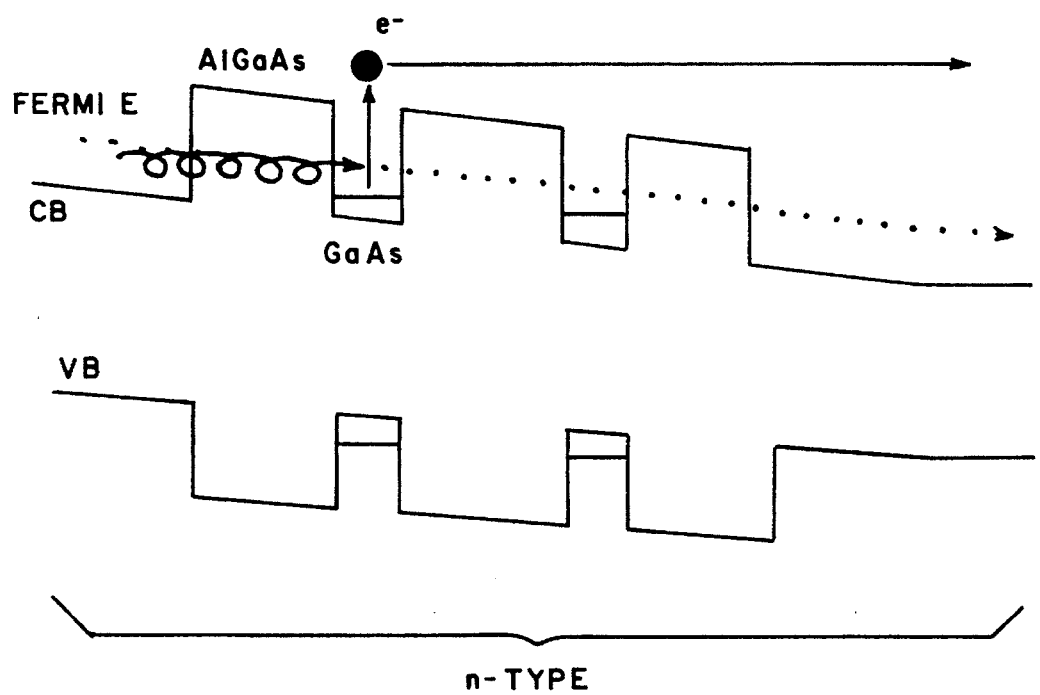
FIG. 2B represents an energy band diagram of the conventional quantum well infrared photodetector as shown in FIG. 2A.
Figure 3A:
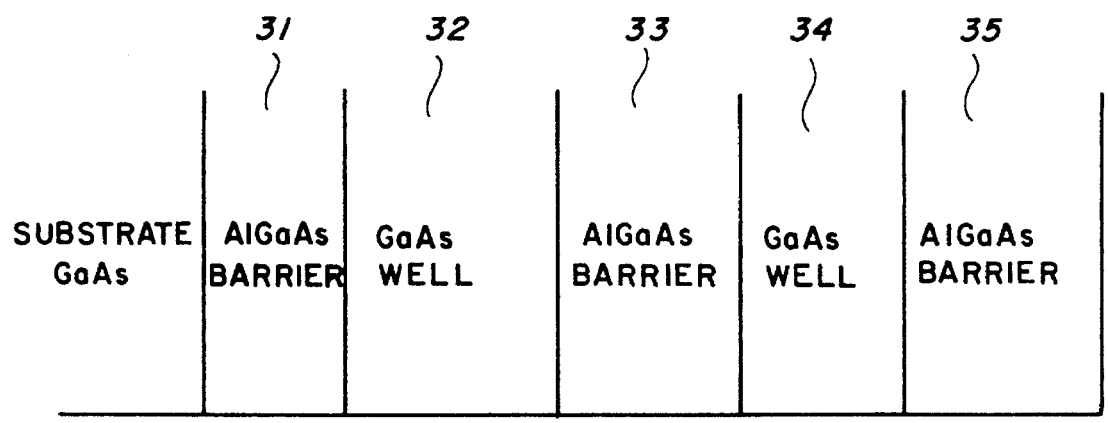
FIG. 3A illustrates a conventional quantum well infrared photodetector for directly converting infrared radiation into visible radiation.
Figure 3B:
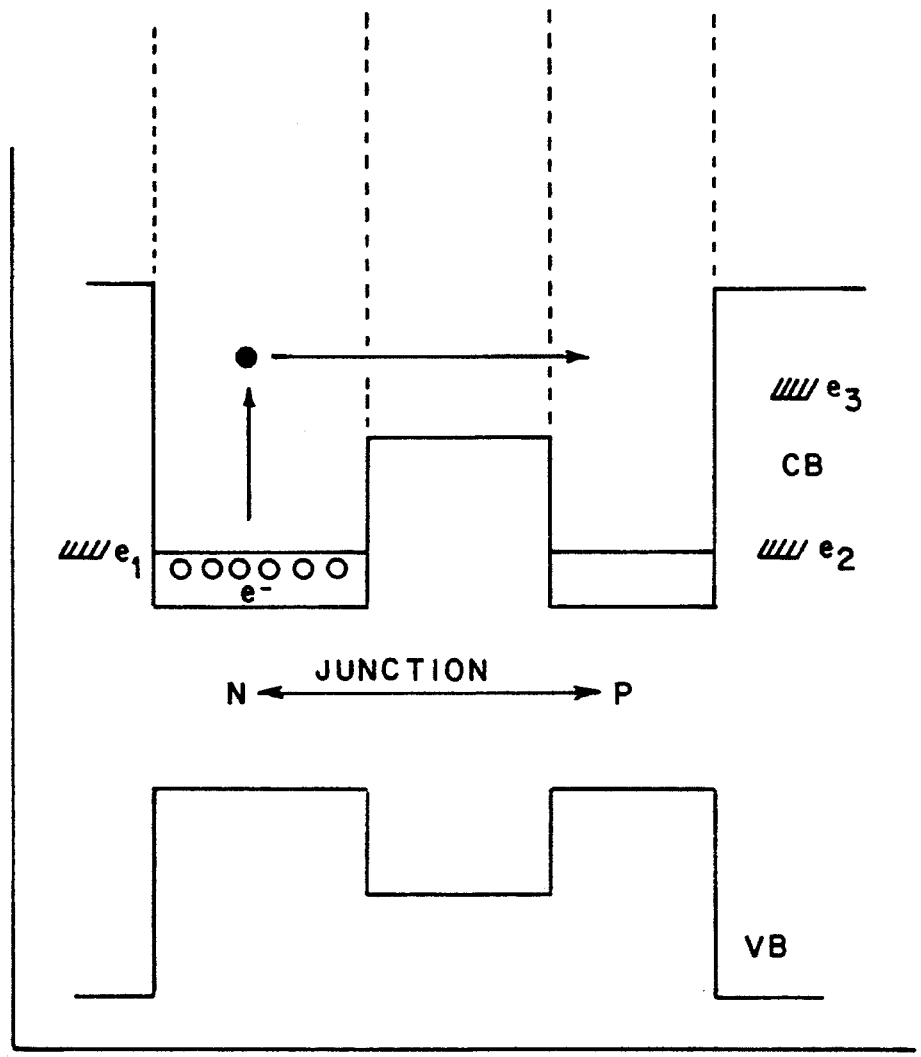
FIG. 3B represents an energy band diagram of the conventional quantum well infrared photodetector as shown in FIG. 3A.
Figure 4A:
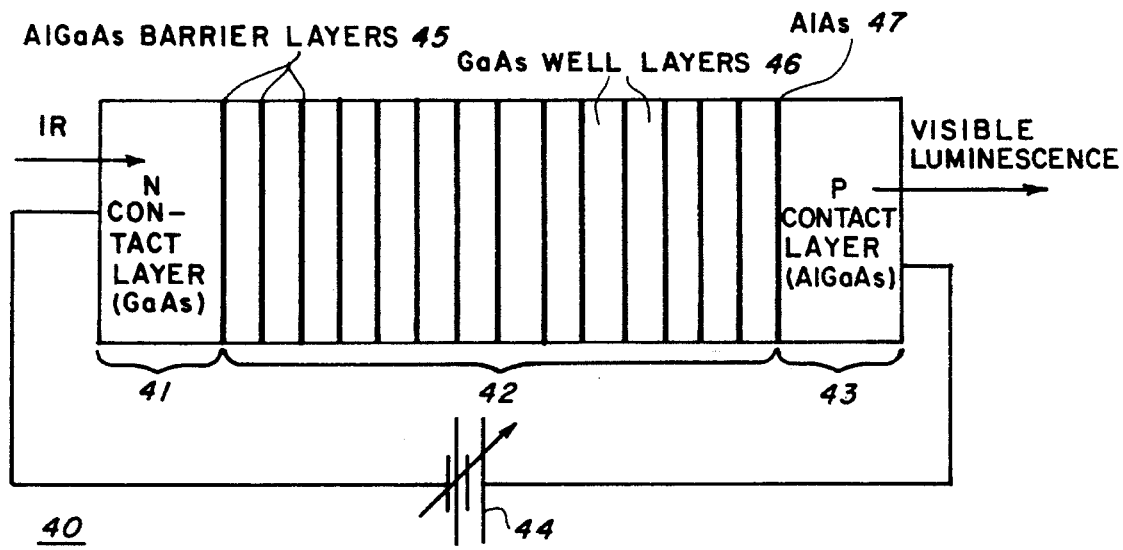
FIG. 4A illustrates an infrared-to-visible converter in a forward-biased state as contemplated by the present invention.

Turning first now to FIG. 4A of the present invention, an infrared-to-visible converter 40 includes a voltage source 44 for controlling the voltage bias of a P-N junction comprised of multiple quantum well structures. Quantum well structures are known as structures "formed by sandwiching a very thin layer of a small band-gap material between two layers of a wide band-gap material." (See R. H. Bube, "Electrons in Solids: An Introductory Survey", 1992 Academic Press, 3rd edition, p 238) The small band-gap layers "are so thin that the energy levels in them show the quantum effects of a small potential well thickness, which causes the continuous allowed levels associated with macroscopic thicknesses to become the discrete allowed spectrum" of thin potential wells. Ibid. A multiple quantum well structure is simply a series of such sandwiches. For the purpose of the present invention, the small band-gap layer (i.e., the inner layer of the sandwich) must be thin enough that an electron has coherence over the entire width of the inner layer, and thereby constitutes a well. Such well layers should have a thickness in the range of 10–500 Angstroms. The wide band-gap layer (i.e., the outer layer of the sandwich) constitutes a barrier with sufficient width so that the quantum states of adjacent inner layers are independent of each other. Such barrier layers should have a thickness in the range of about 50–1000 Angstroms.

The infrared-to-visible converter 40 also includes a first contact layer 41 of N-type impurities and a second contact layer 43 of P-type impurities forming a P-N junction 43-41, whereby the multiple quantum well structure 42 is formed in between the P-N junction 43-41 by either molecular beam epitaxial (MBE) or metal organochemical vapor deposition (MOCVD) for accurately controlling the compositions and thicknesses of the various epitaxial layers of barriers and quantum wells. Other fabrication techniques such as vapor phase epitaxy and liquid phase epitaxy may also be used if they are available. Specifically, the first contact layer 41 is formed by a substrate of gallium arsenide (GaAs) of N-type impurities; and the second contact layer 43 is formed by a layer of aluminum gallium arsenide (AlGaAs) of P-type impurities. The multiple quantum well structure 42 has a plurality of alternating aluminum gallium arsenide (AlGaAs) barrier layers 45 and gallium arsenide (GaAs) well layers 46 in the range of approximately 10–200, and most preferably 20–100.

Both the aluminum gallium arsenide (AlGaAs) barrier layers 45 and the gallium arsenide (GaAs) quantum well layers 46 are heavily doped with N-type impurities to form a double heterojunction structure. Aluminum gallium arsenide (AlGaAs) barrier layers 45 are generally formed of 26% Al and 74% Ga and act as an insulative region between the adjacent gallium arsenide (GaAs) quantum well layers. That is, the composition of the aluminum gallium arsenide (AlGaAs) barrier layers should be $Al_xGa_{1-x}As$, where x is approximately 0.1–0.4, and preferably at 0.26. As mentioned earlier, the thickness of each of the aluminum gallium arsenide (AlGaAs) barrier layers 45 should be within the conventional range of 50–500 Angstroms, and preferably in the range of 200–300 Angstroms. Similarly, the thickness of each of the gallium arsenide (GaAs) well layers 46 should be within the range of 10–500 Angstroms, and preferably in the range of 20–300 Angstroms.

Figure 4B:
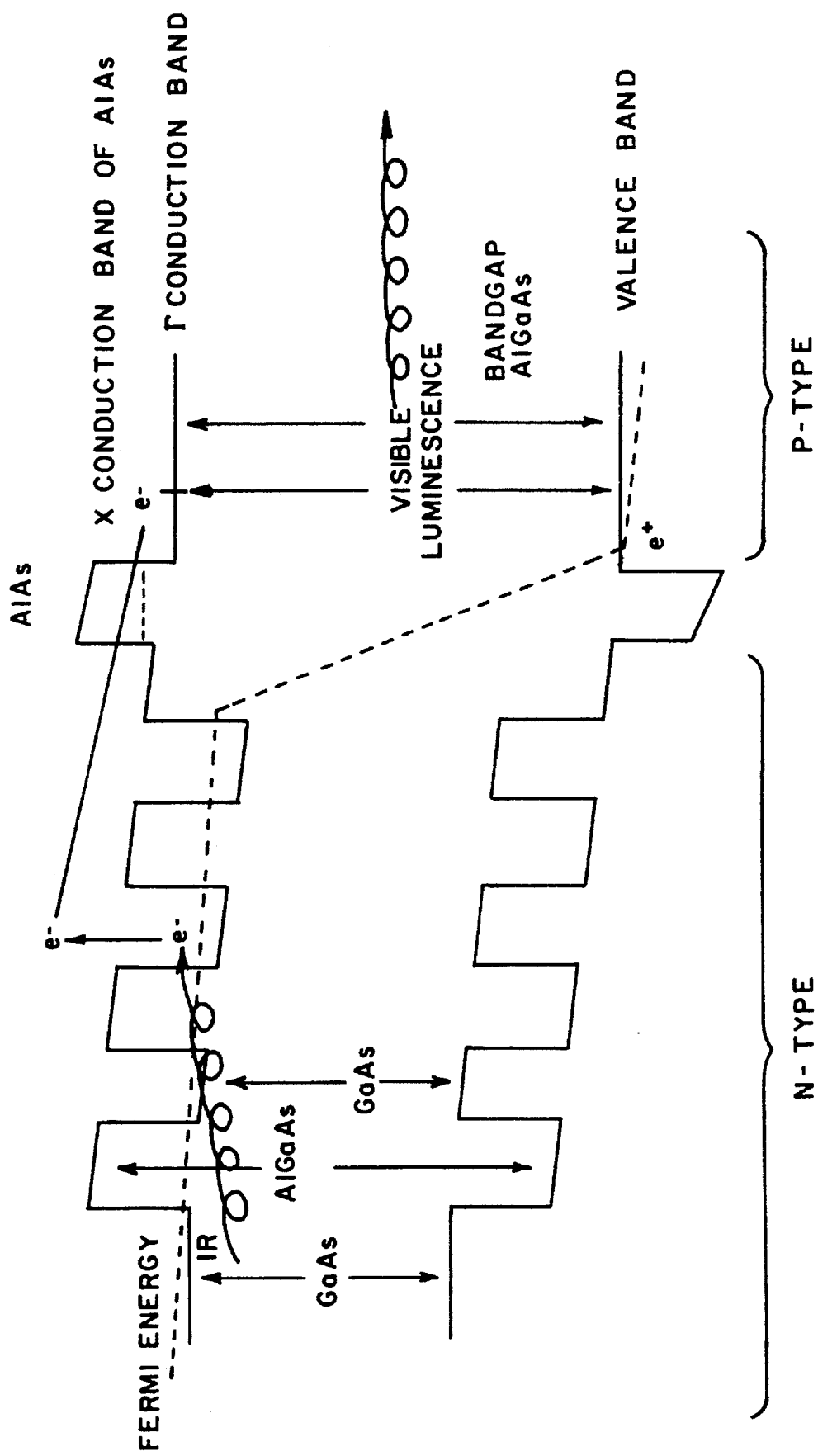
FIG. 4B represents an energy band diagram of the infrared-to-visible converter as shown in FIG. 4A.

The last aluminum gallium arsenide (AlGaAs) barrier layer 45 adjacent to the P-type contact layer 43 has a blocking barrier 47 of aluminum arsenide (AlAs) used to prevent holes from the P-type contact layer 43 from drifting into the quantum well region 46 which would otherwise give rise to extraneous luminescence. The presence of the aluminum arsenide (AlAs) layer 47 advantageously prevents holes from drifting out of the P-type contact layer 43 and into the quantum well region 46 while allowing photoexcited electrons to easily flow into the P-type contact layer 43. Thus, the usefulness of this aluminum arsenide (AlAs) layer 47 is twofold. First, it is designed to prevent holes which otherwise would drift out of the P-type contact layer 43 into the quantum well region 46 because the valence band of the aluminum gallium arsenide (AlGaAs) barrier layers 45 in the quantum wells 46 are not sufficiently high enough to block these holes from drifting out of the P-type contact layer 43. Second, it allows the electrons to pass into the P-type contact layer 43 without impediments because of the relation between the X-conduction band minimum and the Γ-conduction band minimum in AlAs. In general, for GaAs and for $Al_xGa_{1-x}As$ with the above values of x, the X-conduction band minimum is significantly higher than the Γ-conduction band minimum. Therefore, as shown in FIG. 4B, for electrons in the N contact layer 41, the GaAs well layers 46, the AlGaAs barrier layers 45, and the P contact layer 43, the Γ-conduction band, and not the X-conduction band, is relevant. However, the AlAs layer 46 has an X conduction band minimum lower than the Γ conduction band minimum. That is, since the X conduction band of the AlAs blocking layer 47 has an energy barrier significantly lower than that of the Γ conduction band, the electrons can easily pass over the barrier presented by the X conduction band into the P-type contact layer 43 without much impediments. As for the dimensions of the aluminum arsenide (AlAs) layer 47, it should have a thickness within the range of 100–1000Å, and preferably be of approximately 300Å.

The width and band gap of the well, the width and band gap of the barrier, and the alloy concentration in AlGaAs can be individually adjusted as a design consideration. N-type and P-type contact layers 41 and 43 each have a thickness within the range of 0.05–1 μm; and both are positioned to accept a bias potential within the range of 1.50–10.00 Volts from a voltage source 44. The multiple quantum well structure 42 is formed to have a wider band gap than that of the adjacent P-type and N-type contact layers 41 and 43 in order to enable the P-N junction 43-41 to operate well beyond the flat band condition. That is, when the P-N junction 43-41 is biased with a forward voltage greater than the built-in potential between the P-type and N-type contact layers 41 and 43, the recombination of photogenerated carriers across the P-N junction 43-41 is enhanced and thereby produces emitted luminescence in response to illumination with infrared radiation. The wavelength of the emitted luminescence is determined by the band-gap of the P-type contact layer 43.

Ordinarily, conventional P-N photodiodes do not operate in a flat band or beyond a flat band condition due to the reduction of the built-in potential across the P-N junction and the exponential growth of injected dark current which results in a voltage drop across the photodiode series resistance or in damage to the photodiode. An exception however, is in Gerard et al. '992 where the P-N photodiode does operate in a flat band condition, but only when it is prompted with an optical regeneration source (i.e., pulse light); and thus, as mentioned earlier, the Gerard device fails to obtain sufficient and consistent level of sensitivity. In 1985 however, Capasso et al. in "New Quantum Photoconductivity And Large Photocurrent Gain By Effective-Mass Filtering In A Forward-Biased Superlattice P-N Junction" Physical Review Letters, Vol 55, No 10, 2 Sep. 1985, pages 1152–1155, found that high resistance undoped heterostructures of alternating layers of $Al_{0.48}In_{0.52}As$ barrier layers and $Ga_{0.47}In_{0.53}As$ quantum well layers, placed in the junction of P-N diodes, restrict the forward dark current sufficiently such, that the P-N junction can be forward-biased well beyond the flat band condition to obtain a high photocurrent gain. Capasso et al. however, envisions only interband transition of photoexcited electrons; that is the transition of electrons from a valence band to a conduction band, which would only lead to luminescence at or near the wavelength of the incident infrared or visible radiation.

The structure represented by FIG. 4A, in contradistinction, contemplates excitation by an intraband transition (conduction band state to conduction band state) of photoexcited electrons which leads to luminescence through interband transition (between conduction band and valence band) of appreciably shorter wavelength than the incident infrared radiation. FIG. 4A shows a high resistance heterostructure of a P-N junction 43-41 designed to restrict the forward dark current sufficiently to accommodate the forward-biasing of the multiple quantum well structure 42 beyond the flat band condition for enabling high photocurrent gain and subsequently producing band-gap luminescence. That is, when the P-N junction 43-41 is constructed with a multiple quantum well structure 42 in alternating layers of aluminum gallium arsenide (AlGaAs) barriers 45 and gallium arsenide (GaAs) quantum wells 46 and is disposed between a P-type contact layer 43 and a N-type contact layer 41 with a forward bias voltage greater than the built-in potential as is shown in FIG. 4A, band-gap luminescence is produced when photoexcited electrons are driven by the applied electric field into the P-type contact layer 43.

In accordance with the infrared-to-visible converter 40 as contemplated by the present invention, if the $Al_xGa_{x-1}As$ barrier layers 45, where x=0.26, and the GaAs quantum wells 46 of 4 nm thickness are used, the infrared-to-visible converter 40 (i.e., QWIP detector) would have a peak sensitivity at ~10 μm and would emit light at ~650 nm. Moreover, luminescence quantum efficiency of ~0.5 should be easily achievable using high quality MBE. The infrared-to-visible converter 40 would produce a photocurrent of ~2 mA/cm² and ~2 mW/cm² of luminescence when exposed to a 300° K. black body. Some of the emitted luminescence does not leave the sample because of internal reflection and absorption.

When a bias potential from the voltage source 44 is provided in a forward bias state; that is, when the bias potential between the P-type and N-type contact layers 41 and 43 is greater than the built-in potential between the P-N junction 43-41, and when the N-type contact layer 41 is illuminated with infrared radiation, the forward-biased current is carried across the junction mainly by photoexcited electrons (not shown) injected into the P-type contact layer 43 to emit luminescence as a result of the recombination of excess electrons with holes (not shown) which are resident in the P-type contact layer 43.

While the combination of aluminum gallium arsenide (AlGaAs) barrier layers 45 and the gallium arsenide (GaAs) quantum well layers 46 has been described as being used to construct a multiple quantum well structure 42, other combinations of quantum well types are also possible as long as they have different band-gaps (e.g., barrier layers should have larger band-gaps than well layers) and are lattice-matched as well as being selected from direct band-gap compounds such as aluminum (Al), gallium (Ga), indium (In), phosphorus (P), arsenic (As) and antimony (Sb) from the Group III–V of the periodic table. Direct band-gap compounds are desirable to enable efficient luminescence of the photoexcited electrons with holes via intraband transition. For example, compounds such as InGaAs/InP, InAlAs/InGaAs, GaAlSb/GaSb, and the like may be substituted for the multiple quantum well structure 42 shown in FIG. 4A in order to achieve radiation conversion at other wavelengths. Actual wavelengths vary according to the particular proportions of the pairs of group III and group V elements used during the device fabrication.

Devices incorporating these and other compounds may be discrete, hybrid or integrated. Direct band-gap compounds such as InGaAs/InP and. InAlAs/InGaAs, may be grown on a substrate of InP for a lattice match. Similarly, the remainder compounds of GaAlSb/GaSb may be grown on a substrate of GaSb. Fabrication techniques for Group III–V compounds are the same as that of the multiple quantum well structure 42 as shown in FIG. 4A, namely by either molecular beam epitaxial, metal organochemical vapor deposition or other methods known in the art.

Turning now to FIG. 4B, FIG. 4B illustrates a schematic energy-band diagram of the infrared-to-visible converter 40 shown in FIG. 4A. In general, dopant electrons "e-" bound in the quantum well layers of GaAs 46 are optically excited by illumination of infrared radiation via the first contact layer 41 of N-type impurities and accelerated above the tops of the AlGaAs barriers 45 into the second contact layer 43 of P-type impurities, where intraband luminescence will occur through recombination. The wavelength of the luminescence is determined by the band-gap of the P-type contact layer 43 while the infrared absorption characteristics are determined by the heterostructure band offsets. Thus, in principle both of these parameters can be tuned independently such that both the detection wavelength and the wavelength of the emitted luminescence can be controlled in the design of the: device. Similarly, the width and band-gap of the aluminum gallium arsenide (AlGaAs) barrier layers 45 and the gallium arsenide (GaAs) well layers 46 as well as the alloy concentration of these layers can be individually adjusted in accordance with incident and luminescence wavelengths and energy sensitivity for specific applications. More specifically, FIG. 4B illustrates an energy diagram of a GaAs substrate of the first contact layer 41, a multiple quantum well structure 42 comprising a plurality of alternating aluminum gallium arsenide (AlGaAs) barrier layers 45 and gallium arsenide (GaAs) well layers 46, an aluminum arsenide (AlAs) blocking layer 47 positioned adjacent to a last gallium arsenide (GaAs) well layer, and finally a second contact layer 43 of P-type impurities with a band-gap designed to control the wavelength of emitted luminescence. As mentioned earlier, both the aluminum gallium arsenide (AlGaAs) barrier layers 45 and gallium arsenide (GaAs) well layers 46 are heavily doped N-type impurities as is the first contact layer 41. The second contact layer 43 of AlGaAs, in contrast, is lightly doped with P-type impurities. As a result, the Fermi energy positioned in the conduction band in N-type impurities moves down into the valence band in P-type impurities. When a forward voltage is applied by a voltage source 44, and when infrared radiation is illuminated on the N-type contact layer 41, electrons "e-" are carried across the junction and injected into the Γ conduction band of the lightly doped P-type contact layer 43 over the relatively low energy barrier of the X conduction band of the aluminum arsenide (AlAs) block layer 47; and it is from there that the band-gap luminescence is produced.

Figure 5A:
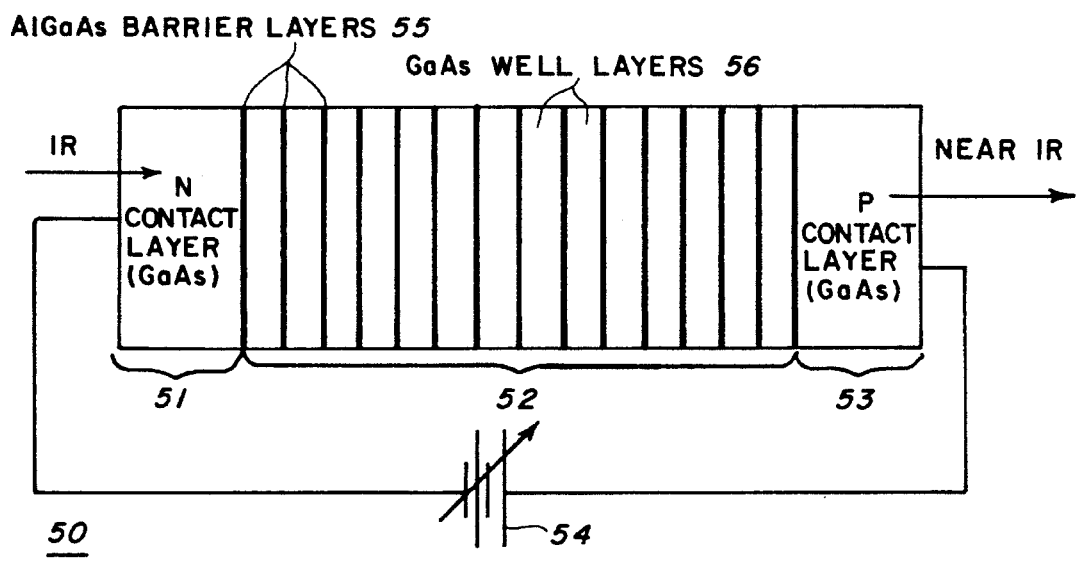
FIG. 5A illustrates the infrared-to-near-infrared converter in a forward-biased state as contemplated by the present invention.

FIG. 5A illustrates a second embodiment of the present invention directed to an infrared-to-near-infrared converter 50. The structure of the infrared-to-near-infrared converter 50 is similar to that of the infrared-to-visible converter 40, except that there is no aluminum arsenide (AlAs) blocking layer 47 (see FIG. 4A) and the P-type contact layer 53 is formed by gallium arsenide (GaAs) materials instead of aluminum gallium arsenide (AlGaAs) materials and has a narrower band gap than that of the P-type contact layer 47 of the infrared-to-visible converter 40. In other words, the infrared-to-near-infrared converter 50 as shown in FIG. 5A only comprises first and second contact layers 51 and 53 formed by a substrate of gallium arsenide (GaAs) of N-type and P-type impurities, respectively, and a multiple quantum well structure 52 having a similar number of alternating aluminum gallium arsenide (AlGaAs) barrier layers 55 and gallium arsenide (GaAs) well layers 56 in the range of 20–200 layers, and most preferably 50–100 layers. Both the aluminum gallium arsenide barrier (AlGaAs) layers 55 and the gallium arsenide (GaAs) quantum well layers 56 are heavily doped with N-type impurities to form a double heterojunction structure 52. In addition, a voltage source 54 is also used to control the voltage bias of the P-N junction 53-51 well beyond the flat band condition in order to emit near infrared radiation in the range of 820 nm from the GaAs band-gap (i.e., the P-type contact layer 53). Again, the wavelength of the near infrared radiation is determined by the band-gap of the P-type contact layer 53 while the infrared absorption characteristics are determined by the heterostructure band offsets. Thus, both the detection wavelength and the wavelength of the emitted near infrared radiation can be controlled in the design of the device. This near infrared radiation can then be easily observed with commercial Si CCD cameras and readily converted into visible light by commercially available off-the-shelf converter devices.

As discussed above with regard to the alternative compounds for the multiple quantum well structure 42 of FIG. 4A, the multiple quantum well structure 52 of FIG. 5A may also be substituted with lattice-matched and direct band-gap compounds from the Group III–V, such as InGaAsP/InP, InAlAs/InGaAs, and GaAlSb/GaSb, compounds in order to achieve a similar type of radiation conversion.

Figure 5B:
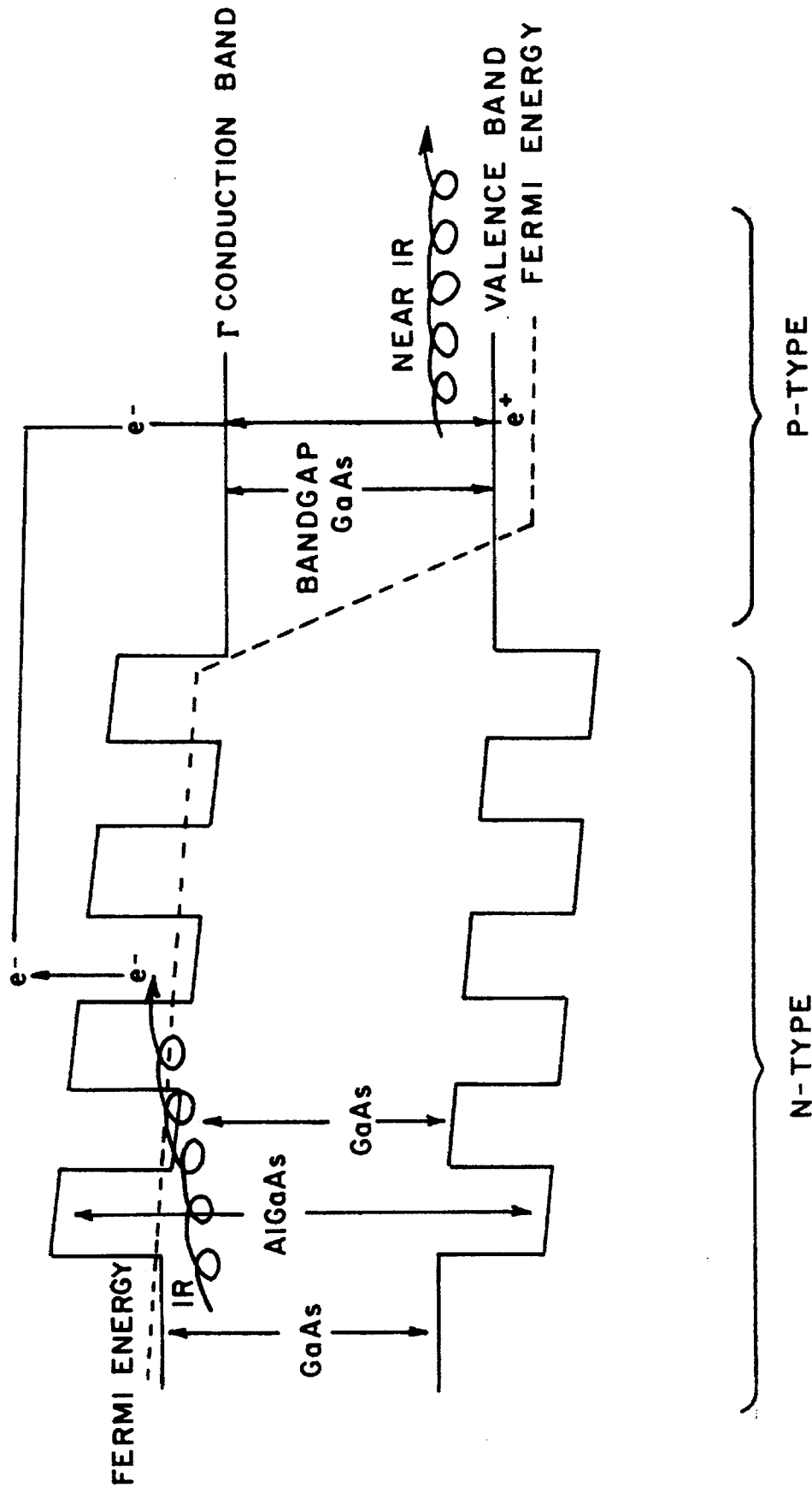
FIG. 5B represents an energy band diagram of the infrared-to-near-infrared converter as shown in FIG. 5A.

FIG. 5B illustrates a schematic energy-band diagram of the infrared-to-near-infrared converter shown in FIG. 5A; dopant electrons bound in the quantum well layers of GaAs 56 are optically excited by illumination of infrared radiation IR via the N-type GaAs contact layer 51 and accelerated above the tops of the barriers of AlGaAs 55 into the P-type GaAs contact layer 53, where intraband near infrared radiation occurs through recombination in the GaAs band-gap (i.e., the P-type contact layer 53).

Figure 6:
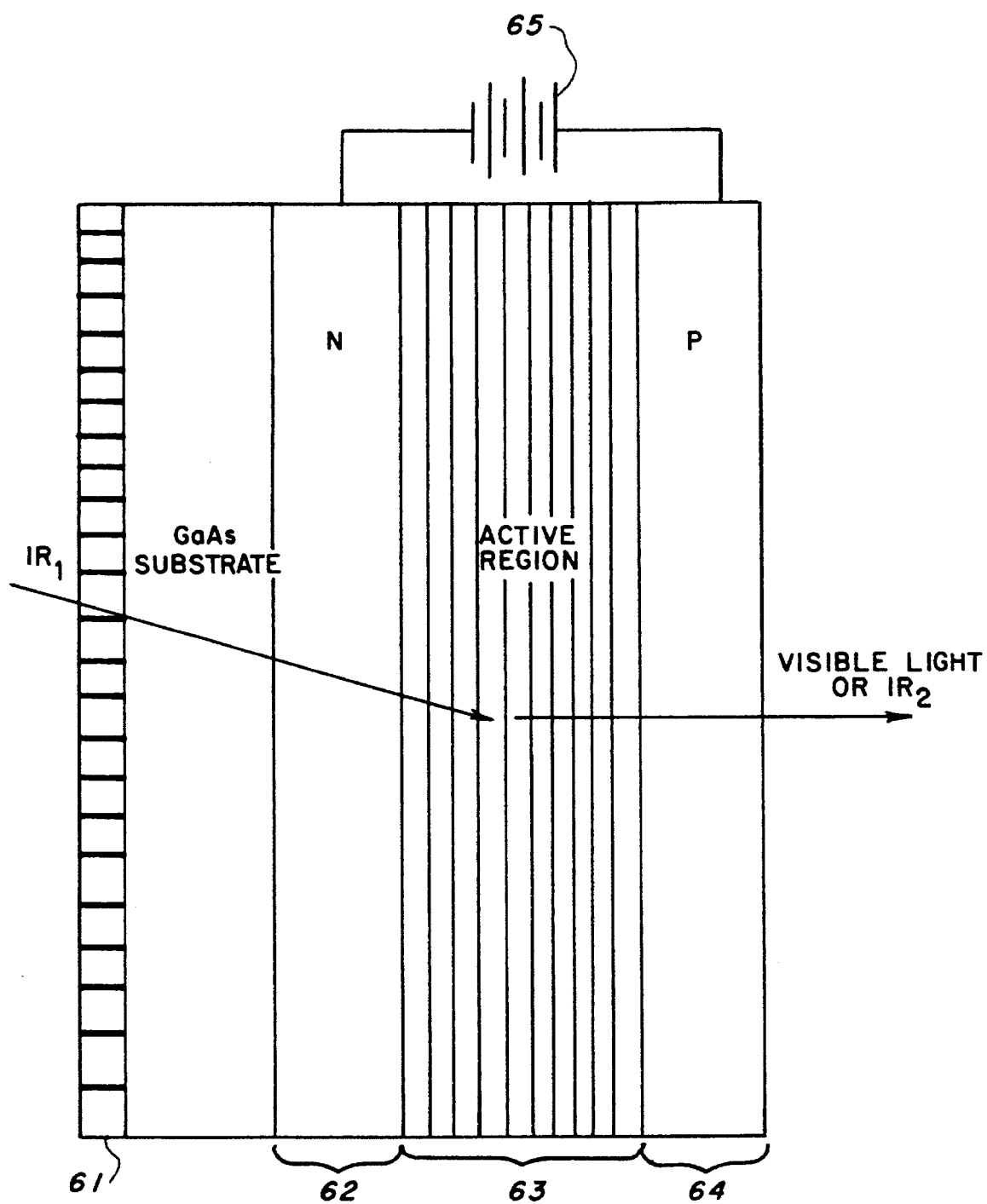
FIG. 6 illustrates a preferred embodiment of converters constructed according to the principles of the present invention.

FIG. 6 illustrates the structure of a preferred embodiment of either the infrared-to-visible or infrared-to-near-infrared converter constructed according to the principles of the present invention. That is, in addition to the N-type and P-type contact layers 62 and 64 and the multiple quantum well structure 63, optional gratings 61 are used to enhance absorption efficiency of the infrared radiation impingent onto the gallium arsenide (GaAs) substrate 62 when the bias potential from the voltage source 65 is provided in a forward bias state in order to enable emission of either visible luminescence or near infrared radiation. Thus, optional gratings 61 may be added to the infrared-to-visible converter 40 as shown in FIG. 4A or the infrared-to-near-infrared converter 50 as shown in FIG. 5A in order to enhance absorption efficiency of the infrared radiation impingent onto the N-type GaAs contact layers 41 and 51, respectively.

While preferred embodiments of the invention have been particularly shown and described, it will be understood by those skilled in the art that foregoing and other changes in form and details may be made without departing from the spirit and scope of the invention as defined in the appended claims and that it may be possible, for example, to manipulate the multiple quantum well structure with different sizes, different dope etc. in order to efficiently convert infrared radiation into visible radiation.

What is claimed is:

1. A device for converting a first light radiation into a second light radiations, comprising:

(a) a first contact region doped with first type impurities;

(b) a second contact region disposed on said first contact region, said second contact region being doped with second type impurities opposite to said first type impurities, said first contact region and said second contact region forming a P-N junction;

(c) a quantum well structure comprising a plurality of alternating quantum well layers and barrier layers formed between said first contact region and said second contact region within said P-N junction, both said quantum well layers and said barrier layers being heavily doped with said first type impurities;

(d) a blocking layer disposed between a last barrier layer and said second contact region, said blocking layer being an aluminum arsenide block layer formed to prevent holes from the second contact region from drifting into said quantum well structure; and (e) a voltage source electrically connected to said first and second contact regions, for forward biasing said P-N junction to enable said device to emit said second light radiation by radiative recombination of excess carriers representative of electrons and holes in said second contact region, when said first contact region is illuminated with said first light radiation.

2. The device as claimed in claim 1, further comprised of said aluminum arsenide block layer having a thickness within the range of 100–1000Å.

3. The device as claimed in claim 2, further comprised of said aluminum arsenide block layer having a thickness about 300Å.

4. A device for converting a first light radiation into a second light radiation, comprising:

(a) a first contact region doped with first type impurities;

(b) a second contact region disposed on said first contact region, said second contact region being doped with second type impurities opposite to said type impurities, said first contact region and said second contact region forming a P-N junction;

(c) a quantum well structure comprising a plurality of alternating quantum well layers and barrier layers formed between said first contact region and said second contact region within said P-N junction, both quantum well layers and said barrier layers being heavily doped with said first type impurities, said quantum well structure comprising approximately 50–100 alternating quantum well layers and barrier layers, said quantum well layers being formed by gallium arsenide having a thickness in the range of 10–500 Angstroms and said barrier layers being formed by aluminum gallium arsenide having a thickness in the range of 50–500 Angstroms;

(d) a blocking layer disposed between a last barrier layer and said second contact region; and (e) a voltage source electrically connected to said first and second contact regions, for forward biasing said P-N junction to enable said device to emit said second light radiation by radiative recombination of excess carriers representative of electrons and holes in said second contact region, when said first contact region is illuminated with said first light radiation.

5. The device for converting a first light radiation into a second light radiation, comprising:

(a) a first contact region doped with first type impurities;

(b) a second contact region disposed on said first contact region, said second contact region being doped with second type impurities opposite to said type impurities, said first contact region and said second contact region forming a P-N junction;

(c) a quantum well structure comprising a plurality of alternating quantum well layers and barrier layers formed between said first contact region and said second contact region within said P-N junction, both quantum well layers and said barrier layers being heavily doped with said first type impurities, said quantum well structure comprising approximately 50–100 alternating quantum well layers and barrier layers, said quantum well layers being formed by gallium arsenide having a thickness in the range of 20–300 Angstroms and said barrier layers being formed by aluminum gallium arsenide having a thickness in the (d) a blocking layer disposed between a last barrier layer and said second contact region; and (e) a voltage source electrically connected to said first and second contact regions, for forward biasing said P-N junction to enable said device to emit said second light radiation by radiative recombination of excess carriers representative of electrons and holes in said second contact region, when said first contact region is illuminated with said first light radiation.

6. A device for converting infrared radiation-into-visible radiation, comprising:

a first contact region doped with n-type impurities;

a second contact region disposed on said first contact region, said second contact region being doped with p-type impurities, said first contact region and said second contact region forming a P-N junction;

a multiple quantum well structure comprising a plurality of alternating gallium arsenide quantum well layers and aluminum gallium arsenide barrier layers formed between said first contact region and said second contact region within said P-N junction, both said gallium arsenide quantum well layers and said aluminum gallium arsenide barrier layers being doped with said n-type impurities and forming a double heterojunction structure;

an aluminum arsenide block layer disposed between a last aluminum gallium arsenide barrier layer and said second contact region; and means for forward biasing said P-N junction to enable said device to emit visible radiation by radiative recombination of excess carriers representative of electrons and holes in said second contact region, when said first contact region is illuminated with infrared radiation.

7. The device as claimed in claim 6, wherein said multiple quantum well structure comprises a center region having a wider band-gap than the adjacent first and second contact regions of said P-N junction.

8. The device as claimed in claim 6, wherein said aluminum arsenide layer is formed to prevent holes from the second contact region from drifting into the multiple quantum well structure.

9. The device as claimed in claim 6, further comprised of said multiple quantum well structure comprising approximately 50–100 alternating gallium arsenide quantum well layers and aluminum gallium arsenide barrier layers.

10. The device as claimed in claim 6 wherein each of said aluminum gallium arsenide barrier layers has a thickness in the range of 50–500 Angstroms, and each of said gallium arsenide well layers has a thickness in the range of 10–500 Angstroms.

11. The device as claimed in claim 6, further comprised of each of said aluminum gallium arsenide barrier layers having a thickness in the range of 200–300 Angstroms, and each of said gallium arsenide well layers having a thickness in the range of 20–300 Angstroms.

12. The device as claimed in claim 6, wherein each of said N-type and P-type contact layers each has a thickness in the range of 0.05–1 μm, and both are positioned to accept a bias potential within the range of 1.5–10 Volts from said voltage source.

13. A converter for converting infrared radiation into near infrared radiation, comprising:

a substrate;

a first contact region disposed on said substrate, said first contact region being formed by gallium arsenide materials and doped with n-type impurities;

a second contact region formed by said gallium arsenide materials and doped with p-type impurities, said first contact region and said second contact region forming a P-N junction;

a multiple quantum well structure comprising a plurality of alternating gallium arsenide quantum well layers and aluminum gallium arsenide barrier layers formed between said first contact region and said second contact region, said gallium arsenide quantum well layers and said aluminum gallium arsenide barrier layers being heavily doped with said n-type impurities, for responding to an infrared radiation of a first wavelength, said aluminum gallium arsenide barrier layers having a thickness in the range of 50–500 Angstroms and each of said gallium arsenide well layers having a thickness in the range of 10–500 Angstroms; and means for forward biasing said P-N junction to enable said converter to emit near infrared radiation of a second wavelength different form said first wavelength by radiative recombination of excess carriers representative of electrons and holes in the second contact region, when said first contact region is illuminated with said infrared radiation of said first wavelength.

14. A converter for converting infrared radiation into near infrared radiation, comprising:

a substrate;

a first contact region disposed on said substrate, said first contact region being formed by gallium arsenide materials and doped with n-type impurities;

a second contact region formed by said gallium arsenide materials and doped with p-type impurities, said first contact region and said second contact region forming a P-N junction;

a multiple quantum well structure comprising a plurality of alternating gallium arsenide quantum well layers and aluminum gallium arsenide barrier layers formed between said first contact region and said second contact region, said gallium arsenide quantum well layers and said aluminum gallium arsenide barrier layers being heavily doped with said n-type impurities, for responding to an infrared radiation of a first wavelength, said aluminum gallium arsenide barrier layers having a thickness in the range of 200–300 Angstroms and each of said gallium arsenide well layers having a thickness in the range of 20–300 Angstroms; and means for forward biasing said P-N junction to enable said converter to emit near infrared radiation of a second wavelength different form said first wavelength by radiative recombination of excess carriers representative of electrons and holes in the second contact region, when said first contact region is illuminated with said infrared radiation of said first wavelength.

* * * * *